United States Patent [19]

Berger et al.

[11] Patent Number: 4,680,476
[45] Date of Patent: Jul. 14, 1987

[54] PHOTOSENSITIVE ROW TRANSFER DEVICE PROVIDED WITH NEGATIVE FEEDBACK AMPLIFIERS

[75] Inventors: Jean L. Berger, Grenoble; Louis Brissot, St. Egreve; Yves Cazaux, Grenoble, all of France

[73] Assignee: Thomson-CSF, Paris, France

[21] Appl. No.: 782,139

[22] Filed: Sep. 30, 1985

[30] Foreign Application Priority Data

Oct. 9, 1984 [FR] France ............................... 84 15493

[51] Int. Cl.$^4$ ............................................. H04N 3/14
[52] U.S. Cl. ............................... 250/578; 358/213.26
[58] Field of Search .................... 250/209, 211 J, 578; 358/213; 357/30

[56] References Cited

U.S. PATENT DOCUMENTS 4,506,299  3/1985  Berger et al. ...................... 358/213

FOREIGN PATENT DOCUMENTS 2524751  10/1983  France .
2538200   6/1984  France .
59-107567 6/1984  Japan .

OTHER PUBLICATIONS

IEEE Journal of Solid State Circuits, vol. SC-12, No. 3, Jun. 1977, "A Fast Sample & Hold Charge-sensing Circuit for Protodiode Arrays", (Paul G. A. Jespers, Christian Jusseret & Yves Leduc).

Primary Examiner—Eugene R. LaRoche
Assistant Examiner—Robert J. Pascal
Attorney, Agent, or Firm—Roland Plottel

[57] ABSTRACT

Use is made of a row memory and a read register, in which charge transfer takes place in volume. The threshold voltage of the negative feedback amplifiers is adjusted so that the operating point of the assembly constituted by each amplifier, the diode and the gate of the memory to which it is connected is located in the high gain zone of the transfer characteristic of the amplifier. It is possible to adjust the threshold voltage by an enhancement in its own type of impurities of the zone of the substrate located beneath the gate of one of the MOS transistors constituting the amplifier.

15 Claims, 17 Drawing Figures

FIG_1 PRIOR ART
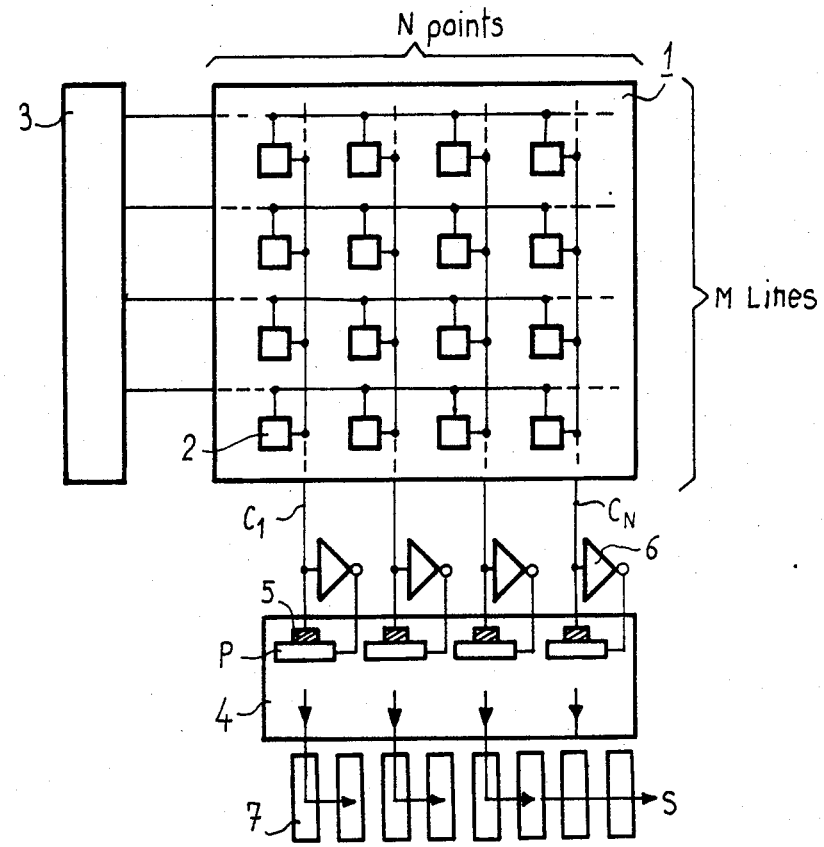
PRIOR ART
FIG_2
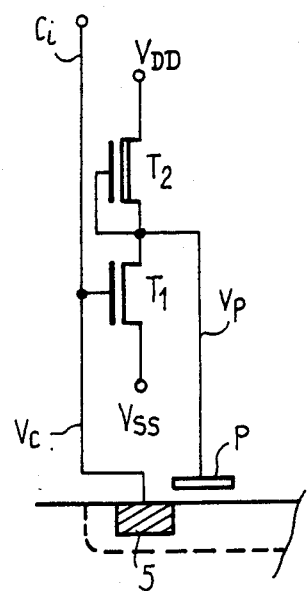

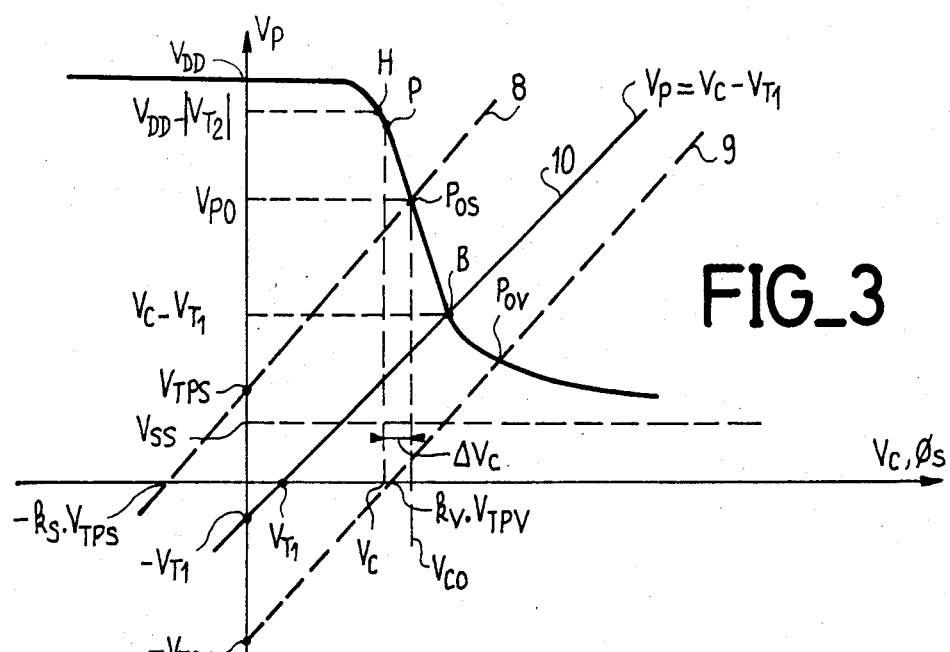
FIG_3
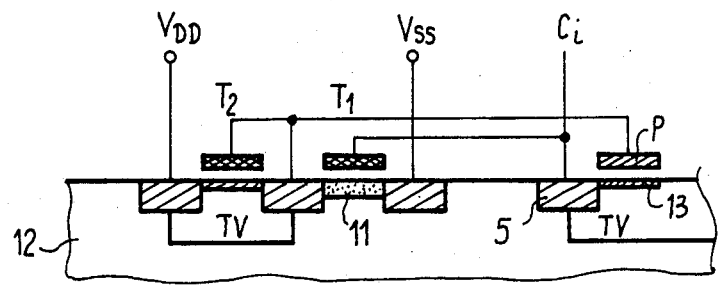
FIG_4
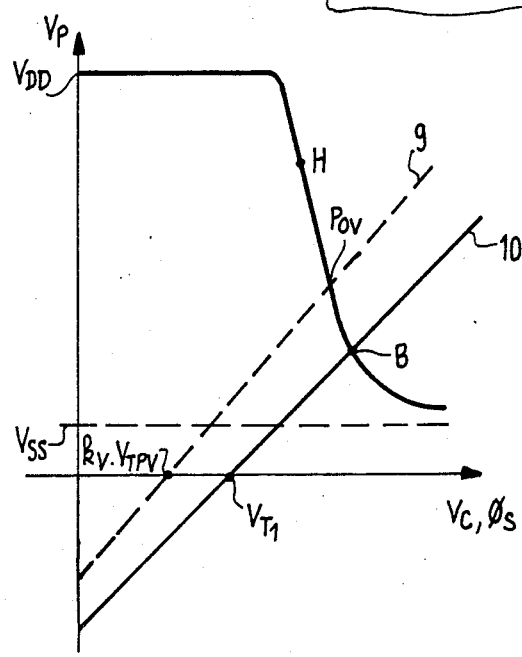
FIG_5

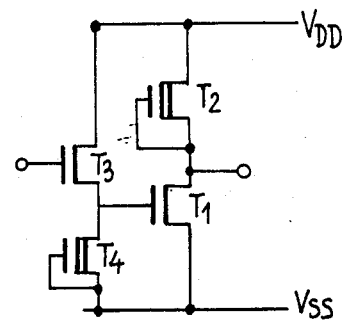
FIG_6
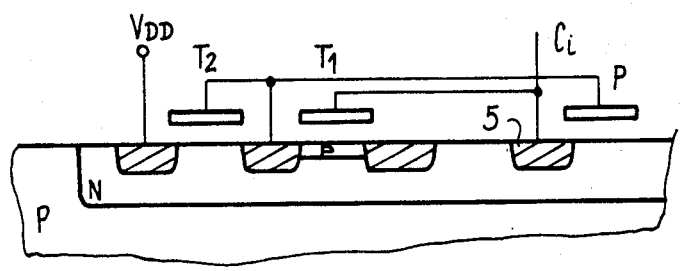
FIG_7
FIG_8 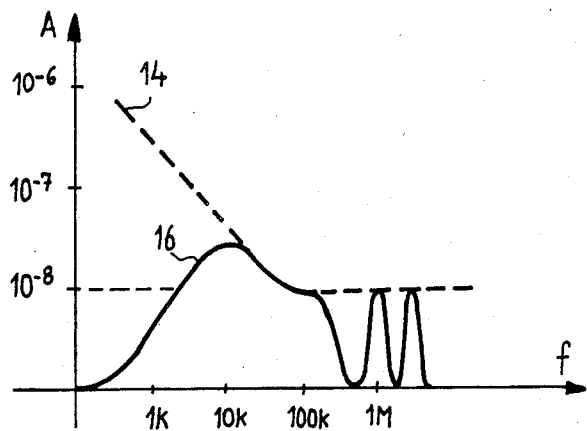
FIG_9 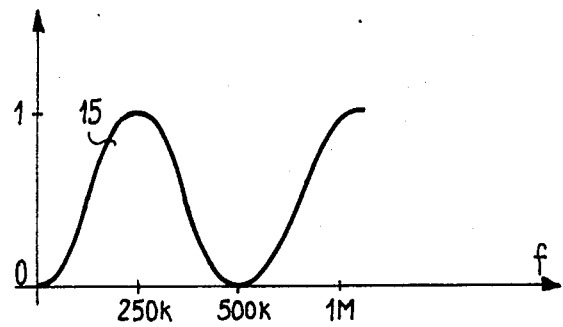

FIG_10-a 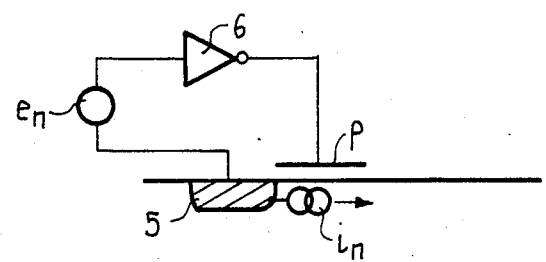
FIG_10-b 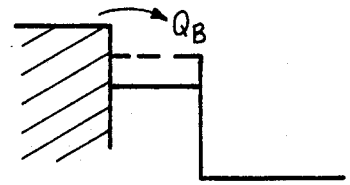
FIG_10-c 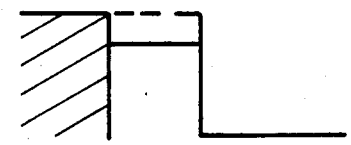
FIG_10-d 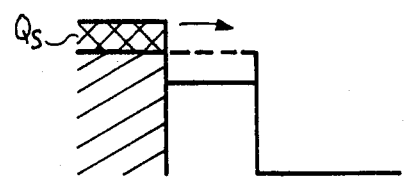
FIG_10-e 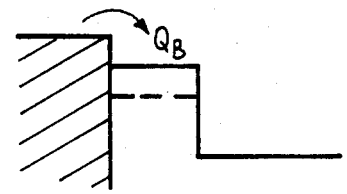
FIG_10-f 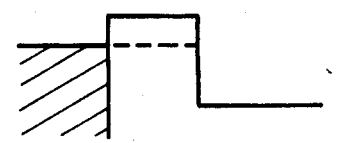
FIG_10-g 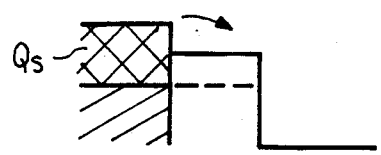

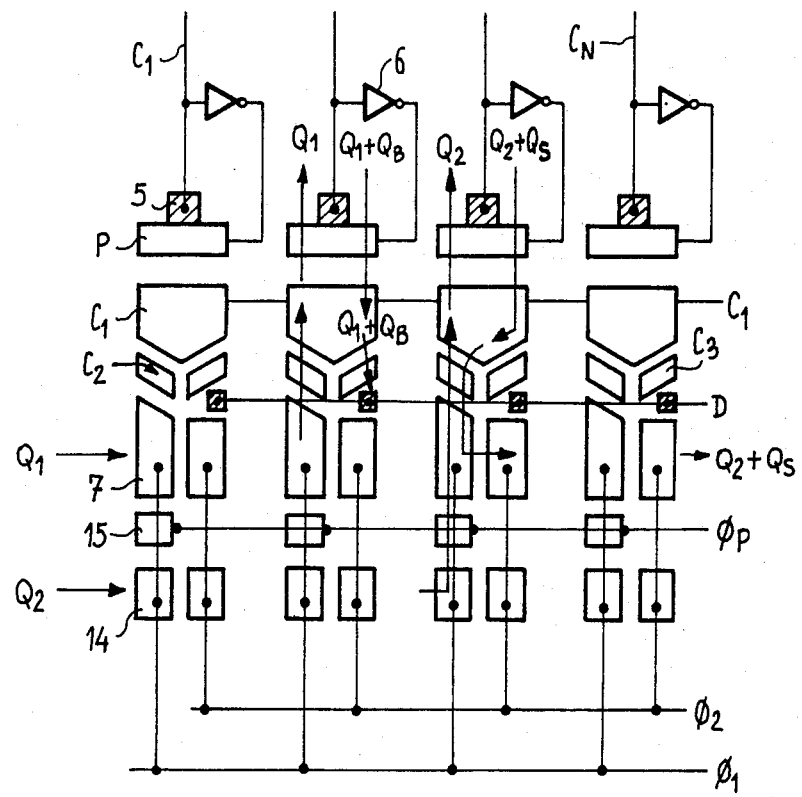
FIG_11

PHOTOSENSITIVE ROW TRANSFER DEVICE PROVIDED WITH NEGATIVE FEEDBACK AMPLIFIERS

BACKGROUND OF THE INVENTION

The present invention relates to a photosensitive row or line transfer device provided with negative feedback amplifiers.

Photosensitive row transfer devices are well known in the art and reference can eg be made to U.S. Pat. No. 4,506,299.

It is pointed out that such devices generally comprise:

a photosensitive zone of M rows of N photosensitive points, on which the image to be read is projected and converted into electrical charges, called signal charges;

an interface member of M points, called the row memory, connected via conductive columns to photosensitive points or elements of the different rows and which receives successively, in a preferred operating mode, parasitic or interfering charges on the columns prior to the arrival of the signal charges and the signal charges stored by each row:

a charge transfer shift register, which receives the signal charges from the memory and supplies in series the electric image analysis signal;

a drain for removing or discharging the parasitic charges from the memory.

U.S. Pat. No. #4,577,231 assigned to the Hitachi Corp., relates to photosensitive row transfer devices provided with negative feedback amplifiers. The input of these amplifiers is connected to a conductive column and to a diode, called the input diode of the row memory and the output thereof is connected to a transfer gate of the memory, adjacent to one of the input diodes.

Negative feedback amplifiers have the advantage of dividing the apparent capacitance C of the conductive columns by G+1, in which G is the gain of the amplifiers, which is generally approximately 50.

Consequently, the transfer of the charges of the columns to the memory take place more rapidly and the transfer efficiency for a given transfer time is improved. The time noise due to the channel located beneath each gate of the memory connected to an amplifier is reduced, because it is proportional to $\sqrt{C}$.

A major disadvantage of negative feedback amplifiers to be demonstrated by the Applicant in the detailed description of the drawings, is that it is not possible if satisfactory operation is required, to connect them to the gate of the memory having a buried channel for the bulk transfer. It is therefore necessary to use gates and consequently a memory with a surface channel for surface transfer.

All the advantages occurring in the case of a memory, having a buried channel have been previously described and the advantages thereof will now briefly be summarized. In order to obtain a maximum transfer efficiency, a buried channel read register is generally used. The use of a memory having a buried channel permits a bilateral transfer of the charges between the memory and the read register, which is particularly advantageous in the case of operation with a double drive charge. In the case where a memory with a surface channel is used, it is not possible to transfer the charges from the register to the memory because, for the same voltage applied to the gates, the surface potentials are at a higher level in the case of a buried channel bulk transfer than in the case of a surface 15 channel transfer. The use of a memory having a buried channel also makes it possible to improve the vertical transfer efficiency. This efficiency is inversely proportional to the capacity of the columns, which is reduced as a result of a buried channel. Thus, the columns are essentially constituted by interconnected read diodes, which are reverse polarized. As a result of the volume transfer, these diodes receive a higher polarization or bias voltage for identical voltages applied to the elements of the row memory and the capacity of the said diodes is reduced. Moreover, the noise during transfers between the columns and the row memory has two origins, namely a thermal noise which is proportional to the square root of the column capacity and a noise which is proportional to the surface and volume traps beneath the transfer gate between the columns and the row memory. The use of buried channels reduces these two components by reducing the capacity of the columns, as was stated hereinbefore and by eliminating interface traps.

Another disadvantage of negative feedback amplifiers is that they introduce noise, more particularly low frequency noise. In certain cases, this noise can be as high as that of the read noise introduced by the transfer gate channel between the columns and the memory.

The present invention makes it possible to solve the aforementioned problems. It more particularly permits the use of a transfer gate between the columns and the memory and of a memory having of the buried channel type. According to a special embodiment, the invention also makes it possible to reduce the low frequency noise due to the negative feedback amplifiers.

BRIEF SUMMARY OF THE INVENTION

The present invention specifically relates to a photosensitive row transfer device with a photosensitive zone of M rows, each row having an N photosensitive points, the photosensitive points of the different rows being connected in parallel by conductive columns to diodes belonging to a row memory, which at least ensures the transfer to a read register of the signal charges of the same row. The photosensitive device has negative feedback amplifiers, each amplifier having an input is connected to a columnn and to a diode of the memory and each amplifier having an output connected to a transfer gate of the memory, adjacent to one of the diodes. The row memory and the read register having a buried channel and provision is made for adjusting the threshold voltage of each amplifier, so that the operating point of the assembly constituted by each amplifier, the diode and the gate of the memory to which it is connected, is located in the high gain zone of the transfer characteristic of the amplifier.

Hereinafter, several embodiments will be described of means making it possible to adjust the threshold voltage of each amplifier.

In order to reduce the low frequency noise due to the amplifiers, the present invention proposes effecting a successive double reading of the parasitic charges on the conductive columns and of the signal charges with two drive charges only. It will be shown hereinafter, that this double reading makes it possible to filter the low frequency noise due to the amplifiers.

BRIEF DESCRIPTION OF THE DRAWINGS

The invention is described in greater detail hereinafter relative to non-limitative embodiments and with reference to the attached drawings, wherein show:

FIG. 1 the diagram of a photosensitive row transfer device provided with negative feedback amplifiers according to the prior art.

FIG. 2 an embodiment of the amplifiers connected to the row memory, according to the prior art.

FIGS. 3 and 5 are graphs illustrating the respective operation of a device according to the prior art and a device according to the invention, respectively.

FIGS. 4, 6 and 7 illustrate various structures for increasing the threshold voltage of the amplifiers.

FIGS. 8, 9 and 10 a to g are graphs and diagrams illustrating the low frequency filtering performed.

FIG. 11 the diagram of an embodiment of a row transfer device provided with negative feedback amplifiers and performing a double reading.

DETAILED DESCRIPTION OF THE PREFERRED EMBODIMENTS

In the various drawings, the same references designate the same elements, but for reasons of clarity, the sizes and proportions of the various elements have not been respected.

FIG. 1 shows a diagram of a known photosensitive row transfer device provided with negative feedback amplifiers.

FIG. 1 diagrammatically shows the photosensitive zone 1 with M rows, each row having N photosensitive points or elements 2. A shift register 3 makes it possible to successively address each row. Conductive columns $C_1$ to $C_N$ connect in parallel the photosensitive points of the same column to a row memory 4. All that is shown are the input diodes 5 of the memory, which are connected to the columns, as well as the transfer gates P adjacent thereto.

Negative feedback amplifiers 6 have their input connected to a conductive column and to an input diode 5 of the memory and their output connected to a transfer gate P between the columns and the memory.

The signal charges from the memory are transferred into a charge transfer shift register 7, called a read register, which supplies for serial readout the electric image analysis signal S.

The amplifiers 6 are constructed in the standard manner by two inverter-connected MOS transistors.

FIG. 2 shows the diagram of an amplifier which is constituted by a MOS enhancement transistor $T_1$ in series with a MOS depletion transistor $T_2$ and which is connected to the row memory. The gate of $T_1$ constitutes the amplifier input which is connected to an input diode 5 of the memory and to a conductive column $C_i$. One of the current carrying electrodes of the transistor $T_1$ is connected to a constant bias voltage $V_{SS}$ and a other current carrying electrode of transistor $T_1$ constitutes the amplifier output, which is connected to a current carrying electrode of transistor $T_2$ and to a gate P for transferring charges from the columns to the memory. The gate of transistor $T_2$ is connected to the amplifier output and the other current-carrying electrode of transistor $T_2$ is connected to a constant bias voltage $DV_{DD}$. In the case where an enhancement transistor $T_2$ is used, its gate is connected to the constant bias $V_{DD}$.

The prior art does not precisely indicate whether the row memory and consequently the gates P for transferring charges between the columns and the memory utilize a surface or a buried channel but it states that the voltages of source and drain must be chosen in such a way that the inverter operates in a high gain zone.

The Applicant will demonstrate hereinafter that such a device can only operate in a satisfactory manner with a row memory and consequently gates P for transferring charges from the column to the memory utilizing a surface channel.

The operating point of the amplifier of FIG. 2 is obtained by the intersection of the amplifier transfer characteristic $V_P$, $V_C$ (in which $V_P$ is the output voltage of the amplifier and $V_C$ its input voltage) with the curve representing the potential $\phi_S$ of the channel beneath gate P, as a function of the voltage $V_P$ applied to said gate.

FIG. 3 shows in continuous line form the amplifier characteristic and in broken line form the curve 8 ($\phi_S$, $V_P$) for gate P in the case of a surface channel and the curve 9 ($\phi_S$, $V_P$) for the gate P in the case of a buried channel.

The two curves 8, 9 of gate P are substantially straight lines with slopes $K_S$ and $K_V$, which are positive and close to unity in the case of standard technology. The intersection points of lines 8 and 9 with the transfer characteristic of the amplifier are called $P_{OS}$ and $P_{OV}$. Lines 8 and 9 intersect axis $V_P$ at ordinate points $V_{TPS}$ and $-V_{TPV}$ and axis $V_C$, $\phi_S$ at abscissa points $-K_S \cdot V_{TPS}$ and $K_V \cdot V_{TPV}$.

On the amplifier transfer characteristic are placed points H and B which define the high gain zone of the amplifier transfer characteristic, which is that for which the two transistors $T_1$ and $T_2$ are biased to saturation. Point H is that from which transistor $T_2$ returns to saturation and has for the ordinate $V_{DD} - |V_{T2}|$, in which $V_{T2}$ is the threshold voltage of transistor $T_2$. Point B is that from which transistor $T_1$ operates in non saturated mode and has for the ordinate $C_C - V_{T1}$, in which $V_{T1}$ is the threshold voltage of MOS transistor $T_1$.

FIG. 3 shows the line 10 of equation $V_P = V_C - V_{T1}$, which intersects axis $V_C$, $\phi_S$ at abscissa $V_{T1}$ and axis $V_P$ at ordinate $-V_{T1}$.

Point $P_{OS}$ is still above point B, because the following inequality is still satisfied: $V_{T1} > -K_S = V_{TPS}$, $V_{T1}$, $K_S$ and $V_{TPS}$ being positive and lines 8 and 10 substantially parallel. For a satisfactory operation, it is also necessary for point $P_{OS}$ not to be too close to point H, because when a charge arrives on a column for transfer, the operating point $P_{OS}$ of abscissa $V_{CO}$ passes into a point P of abscissa $V_C = V_{CO} - V_C$ which is closer to H. The regulation of the voltages $V_{DD}$ and $V_{SS}$ makes it possible to move point $P_{OS}$ away from point H. FIG. 3 shows that the intersection of the amplifier characteristic with axis $V_P$ takes place at ordinate point $V_{DD}$ and that the amplifier characteristic tends towards a horizontal asymptote of ordinate close to $V_{SS}$.

It is possible to regulate voltage $V_{SS}$ and then voltage $V_{DD}$, so that the following condition is satisfied: $V_{DD} - V_{T2} > V_{PO} + G \cdot \Delta V_C$ in which $V_{PO}$ is the ordinate of point $P_{OS}$.

In conclusion with a gate P, having a surface channel the amplifier operates in a high gain zone. Point $P_{OV}$ is still located below point B because the following inequality is still satisfied: $V_{T1} > K_V \cdot V_{TPV}$ and the lines 9 and 10 are substantially parallel. Thus, in standard technologies, $V_{T1}$ varies between 0.5 and 1.5 V and $V_{TPV}$ between 3 and 10 V, with a slope $K_V$ close to unity.

FIG. 3 clearly demonstrates that when line 9 is positioned positively below line 10, it is not possible to pass point $P_{OV}$ between points H and B, even by acting on the bias voltages $V_{DD}$ and $V_{SS}$.

Accordingly, since the prior art states that it is necessary to act on the bias voltages $V_{DD}$ and $V_{SS}$ so that the inverter functions in a high gain zone, this means that it is necessary to use gates P and consequently a row memory, having a surface channel with all the disadvantages involved.

It is not possible to obtain satisfactory operation with gates P and consequently a row memory, having a buried channel when only having bias voltages $V_{DD}$ and $V_{SS}$ are available for regulating the operating point.

According to the invention, satisfactory operation is obtained by using gates P and a row memory, having a buried channel, by displacing the line 10 of equation $V_p = V_C - V_{T1}$ in such a way that line 9 is positioned above line 10. Thus, operating point $P_{OV}$ is positioned between points H and B. FIG. 5 shows a new arrangement of lines 9 and 10 and points $P_{OV}$ and B. According to the invention, means are provided which make it possible to adjust the threshold voltage $V_{T1}$ of each amplifier, so that the following inequality is satisfied: $V_{T1} > K_V \cdot V_{TPV}$. This amplifier threshold voltage is that for which it starts to conduct. In the case of an amplifier embodiment like that shown in FIG. 2, the amplifier threshold voltage is that of the MOS transistor $T_1$.

FIG. 4 shows an embodiment of a structure making it possible to adjust voltage $V_{T1}$. Voltage $V_{T1}$ is increased by providing an enhancement region 11, in its own type of impurities of the zone of substrate 12, located beneath the gate of transistor $T_1$, so as to have: $V_{T1} > K_V \cdot V_{TPV}$.

In FIG. 4 it can be seen that gate P and transistor $T_2$ are realized on a buried channel, designated TV. No matter what the means used for adjusting $V_{T1}$, it is possible to obtain beneath gate P a zone 13 of a type of impurities opposite to that of the buried channel TV beneath such gate. Thus, the value of $V_{TPV}$ is decreased, which makes it possible to more easily satisfy the inequality: $V_{T1} > K_V \cdot V_{TPV}$.

Such doping operations generally take place beneath transfer gates of the read register with a buried channel.

FIG. 6 shows another arrangement making it possible to adjust the threshold voltage of each amplifier. In this case, the amplifier is constituted as in FIG. 1 by two transistors $T_1$ and $T_2$, but further included third and fourth MOS transistors $T_3$ and $T_4$, connected as shown, between each memory input diode 5 and the gate of transistor $T_1$. The threshold voltage of the arrangement of FIG. 6 is equal to $V_{T3} + V_{T1}$, in which $V_{T3}$ is the threshold voltage of MOS transistor $T_3$, whose gate is connected to a diode 5 of the memory.

In the embodiment of FIG. 6, use is made of enhancement MOS transistor $T_3$ and depletion MOS transistor $T_4$. The gate of transistor $T_3$ is connected to the input diode 5 of the memory and to a conductive column, the other two current-carrying electrodes of the transistor are connected to voltage $V_{DD}$ and to the gate of transistor $T_1$. The gate and one current-carrying electrode of transistor $T_4$ are connected to the bias voltage $V_{SS}$, the other current-carrying electrode is connected to the gate of transistor $T_1$.

As a variant, it is possible to use an enhancement MOS transistor $T_4$, whose gate is connected to the gate of MOS transistor $T_1$. Another solution for adjusting the threshold voltage of each amplifier is shown in FIG. 7. It employs an amplifier having two inverter-connected transistors, as in FIG. 2, but in this case use is made of a depletion MOS transistor $T_2$ with an N-type channel and a depletion MOS transistor $T_1$ with a P-type channel, which makes it possible to sufficiently increase the threshold voltage $V_{T1}$ of the amplifier. The use of a depletion MOS transistor $T_1$ makes it possible to reduce noise.

The threshold voltage of the amplifier is in this case adjusted by means of a P-type implantation beneath the gate of transistor $T_1$. It is possible to combine the various means described for adjusting the threshold voltage of the amplifiers.

It is also possible to regulate the operating point by adjusting the bias voltages $V_{DD}$ and $V_{SS}$, but this is not in itself sufficient to ensure that the operating point $P_{OV}$ is located in the high gain zone of the amplifier characteristic.

It was stated in the introduction to the specification that a disadvantage in the use of negative feedback amplifiers is that the noise introduced is essentially low frequency noise.

This noise is due to the MOS transistors. At low frequency, these transistors have a spectral response which varies as 1/f, whose cutoff frequency is between 20 and 100 kHz. At high frequencies, these transistors have a much lower noise level with a spectrum similar to that of white noise.

In FIG. 8, the broken line curve 14 represents the spectral distribution A of the amplifier noise.

The invention offers a solution for reducing the low frequency noise due to the amplifiers, involving performing a double read. This solution will now be explained with reference to FIGS. 10a to 10f.

In the aforementioned known art there is described a reading process in which, the parasitic charges located on the columns are removed before reading the signal charges. In the present invention this double reading is used for filtering the low frequency noise due to the amplifiers, whereas its original objective was the discharge of the parasitic charges.

FIG. 10a an arrangement including a memory input diode 5, with the transfer gate P, the amplifier 6 which is connected between the diode and the memory, and the two main noise sources which are the noise voltage $e_n$ of the amplifier and the noise current $i_n$ of the channel beneath gate P.

The noise current $i_n$ gives rise to a noise proportional to $\sqrt{KTC}$, in which K is the Boltzmann constant, T the temperature and C the capacitance of the columns, which is divided by G+1 as a result of the negative feedback amplifier.

The amplifier noise voltage introduces a fluctuation on the potential barrier beneath gate G, which conditions the charge transfer to the memory.

As a function of the spectral distribution of the noise, the level of this potential barrier varies during the signal charge transfer in the case of high frequency components, or varied between a reading of signal charges and the following reading in the case of low frequency components. The double reading makes it possible to eliminate the low frequency components, as will now be demonstrated.

FIGS. 10b and 10e show in continuous line form the potential barrier beneath gate P when there is no noise and in broken line from the potential barrier beneath gate P in the presence of noise. The noise can lead to an increase or decrease in the barrier level, as is respectively shown in FIGS. 10b and 10e. The reading of the parasitic charges $Q_B$ on the columns leads to the alignment of the potential existing beneath diode 5 with the temporary potential barrier level, as shown in FIGS. 10c and 10f.

Consequently when the signal charges $Q_S$ reach the columns, they are completely transmitted in the manner shown in FIGS. 10d and 10g.

A reading of the signal charges carried out immediately following the reading of the parasitic charges consequently makes it possible to filter the low frequency components of the noise, provided that the potential barrier level beneath gate P has not been changed between the two readings.

The transfer function of such a filtering is expressed as a function of the frequency f of the noise by the relation: $A = 1 - \cos 2\pi f \zeta$, in which $\zeta$ is the time interval between the two readings.

In FIG. 9, curve 15 represents the transfer function of the double read operation.

In FIG. 8, the continuous line curve 16 represents the spectral distribution of the amplifier noise with double reading showing the low frequency filtering performed. The filtering of the low frequency noise by means of double reading has been experimentally proved by artificially injecting noise onto the columns.

In the aforementioned known art, the double reading of the charges necessitates three drive charges. It is necessary to have a drive charge $Q_0$ of approximately 4 to 5 times the maximum signal charge for transferring the charges from the columns to the memory. This very high charge $Q_0$ remains stored beneath capacitances $C_1$ of the memory and it is necessary to have two smaller drive charges $Q_1$ and $Q_2$ for transferring the signal charges $Q_S$ and the parasitic charges $Q_B$ from the memory, respectively to the read register and to the drain.

In the case of a photosensitive row transfer device provided with negative feedback amplifiers, two drive charges $Q_1$ and $Q_2$ are sufficient. Thus, since the apparent capacitance of the columns is divided by $G+1$, the drive charge necessary for an effective transfer of the charges from the columns to the memory can be reduced and a drive charge of approximately one tenth of the maximum signal charge is sufficient.

Such a drive charge can be supplied without difficulty by a charge transfer shift register, without its storage capacity and dimensions being increased for this purpose. Thus, in the device according to the invention use is made of two drive charges $Q_1$ and $Q_2$ of the same amplitude as the prior art charges $Q_1$ and $Q_2$ used both for the transfer of charges from the columns to the memory and from the memory to the read register or the discharge drain. Instead of being stored in the memory, these drive charges are preferably injected by two charge transfer shift registers, which are the read register 7 and an auxiliary register 14, which is used only for the injection of a drive charge.

The novel structure of an embodiment according to the invention is shown in FIG. 11. The row memory only has a single stage with intermediate gates $C_1$, which are no longer used for the storage of the drive charges $Q_0$ but instead for switching the signal charge $Q_S$ to the read register and the parasitic charges $Q_B$ to a drain. This switching takes place via transfer gates $C_2$ and $C^3$, respectively.

FIG. 11 symbolically shows that a drive charge $Q_1$ is obtained by permanently injecting this charge quantity into a read register 7. This drive charge is transferred into the memory prior to the arrival of the charges to be read.

It is possible to obtain this drive charge $Q_1$ in another way, eg by injection at gates $C_1$ of the memory from diodes associated with injection gates.

With regards to the drive charge $Q_2$, it can be introduced into the memory from the discharge drain.

For generating the drive charge $Q_2$, there is shown an auxiliary charge transfer shift register 14, into which is injected in series the charge quantity $Q_2$. This register 14 is positioned parallel to the read register and has gates 15 permitting transfers of drive charges Q2 into the read register. It would also be possible to locate the auxiliary register 14 parallel to the series of input diodes 5 and to transfer the charges $Q_2$ from the register into diodes 5.

In FIG. 11, arrows symbolize the various transfers accompanying the double reading. In the middle two stages stages of the device are shown the transfers permitting the discharge of parasitic charges and the transfers permitting the reading of the signal charges. The drive charges $Q_1$ are transferred from the read register into the memory and then beneath the input diodes 5 of the memory. This is followed by the transfer of charges $Q_1 + Q_B$ to the memory and then to the discharge drain, $Q_B$ being the parasitic charges on the columns.

The drive charges $Q_2$ are transferred from the auxilliary register into the read register, into the memory and then beneath the input diodes 5 of the memory. Prior to the arrival of the signal charges $Q_S$ on the diodes, charges $Q_2 + Q_S$ are transferred into the memory and then into the read register.

All these transfers take place during the row return time. During the row time, the signal charges are read and new drive charges are injected in series into the registers.

For an optimum operation of the device, use is made of charges $Q_1$ and $Q_2$ which are as equal as feasible. This permits a perfect symmetry of the injection members.

Charges $Q_1$ and $Q_2$ can be used for the transfer of both the signal charges and the parasitic charges, except in the embodiment of FIG. 11, where it is firstly necessary to use the drive charges $Q_1$ before transferring the drive charges $Q_2$ into the read register. Then it is necessary to use charges $Q_1$ for transferring the parasitic charges and charges $Q_2$ for transferring the signal charges.

Finally, use is made of an auxilliary register 14, where the transfer of the charges takes place in the bulk, in order to have an optimum transfer efficiency, particularly in the lateral direction. Double reading, apart from reducing the low frequency noise due to the amplifiers, also makes it possible to eliminate parasitic charges.

It is possible to use a photosensitive row transfer device provided with negative feedback amplifiers with an anti-blooming or anti-glare device at each photosensitive point. Even in this case, the use of double reading is of great interest for reducing noise.

What is claimed is:

1. A photosensitive row transfer device having a photosensitive zone of M rows, each row having N photosensitive points, and a buried channel charge transfer row memory comprising N diodes adjacent respectively to N transfer gates, the N photosensitive points of each row being connected in parallel by N conductive columns to said N diodes, said row memory providing bulk transfer to a buried channel charge transfer read register of the signal charges of a same row, said photosensitive device having negative feedback amplifiers, each amplifier having a threshold voltage, and having an input connected both to a column and to a diode of the row memory and an output connected to an adjacent transfer gate, said device further comprising means for adjusting the threshold voltage of each amplifier, so that the operating point of the assembly constituted by each amplifier, an associated diode and an adjacent transfer gate to which said amplifier is connected, is located in the high gain portion of the transfer characteristic of the amplifier.

2. A device according to claim 1, wherein each amplifier comprises first and second inverter-connected MOS transistors.

3. A device according to claim 2, wherein said first transistor is an enhancement MOS transistor having a gate electrode which is the emplifier input, a first current-carrying electrode connected to a constant bias voltage, and a second current-carrying electrode which is the amplifier output and is connected to an electrode of the second MOS transistor.

4. A device according to claim 3, wherein said second transistor is a depletion MOS transistor which has its gate electrode connected to the amplifier output and a current-carrying electrode connected to a constant bias voltage.

5. A device according to claim 3, wherein said second transistor is an enhancement MOS transistor which has its gate electrode which is connected to one of its current-carrying electrodes and to which is applied a constant bias voltage.

6. A device according to claim 2, wherein the adjusting means comprises an enhancement zone of like conductivity type located beneath the gate electrode of the first MOS transistor.

7. A device according to claim 2, wherein the adjusting means is a follower stage having third and fourth MOS transistors inserted between each diode of the memory and input of the associated amplifier, the threshold voltage of each amplifier being adjusted by the threshold voltage of the third MOS transistor, whose gate electrode is connected to the adjacent diode of the memory.

8. A device according to claim 2, wherein said first transistor is a depletion MOS transistor of P-type channel and said second transistor is a depletion MOS transistor of N-type channel.

9. A device according to claim 1, wherein beneath each transfer gate of the memory adjacent to an input diode, there is located a zone of conductivity type opposite to that of the buried channel beneath the transfer gate.

10. A device according to claim 1, wherein the row memory further comprises a series of storage gates adjacent to the transfer gates of the memory connected to the amplifiers, each storage gate being adjacent to two transfer gates, one leading to a discharge drain for the parasitic charges and the other to a read register for the signal charges.

11. A device according to claim 10, wherein the read register is a charge transfer shift register having a plurality of stages, is positioned parallel to the row memory, and has means for injecting a first drive charge into all said stages.

12. A device according to claim 10, having an auxiliary buried channel charge transfer shift register which has a plurality of stages for the bulk transfer of charges, is positioned parallel to the read register, has means for injecting a second drive charge into all its stages, and has gates for transferring said second drive charges into the read register.

13. A device according to claim 10, having an auxiliary buried channel charge transfer shift register which has a plurality of stages for the bulk transfer of charges, has means for injecting a second drive charge into all its stages, and has means allowing the transfer of said second drive charges into the diodes of the memory.

14. A device according to claim 12, wherein the first and second drive charges are equal in amount.

15. A device according to claim 13, wherein the first and second drive charges are equal in amount.

* * * * *